US008993939B2

(12) United States Patent
Morikawa et al.

(10) Patent No.: US 8,993,939 B2
(45) Date of Patent: Mar. 31, 2015

(54) RESISTANCE HEATER

(75) Inventors: Yuji Morikawa, Himeji (JP); Yoshihiko Matsui, Himeji (JP); Akinobu Otaka, Hyogo (JP); Takeshi Higuchi, Hyogo (JP); Kensuke Fujimura, Nasu-machi (JP); Zhong-Hao Lu, Twinsburg, OH (US)

(73) Assignee: Momentive Performance Materials Inc., Waterford, NY (US)

( * ) Notice: Subject to any disclaimer, the term of this patent is extended or adjusted under 35 U.S.C. 154(b) by 0 days.

(21) Appl. No.: 13/424,947

(22) Filed: Mar. 20, 2012

(65) Prior Publication Data

US 2012/0223069 A1 Sep. 6, 2012

Related U.S. Application Data

(63) Continuation-in-part of application No. 12/321,284, filed on Jan. 16, 2009, now Pat. No. 8,164,028.

(60) Provisional application No. 61/021,907, filed on Jan. 18, 2008.

(51) Int. Cl.
*H05B 3/02* (2006.01)
*H05B 3/14* (2006.01)
*H01L 21/67* (2006.01)

(52) U.S. Cl.
CPC .......... *H05B 3/143* (2013.01); *H01L 21/67103* (2013.01)
USPC .......... 219/538

(58) Field of Classification Search
USPC .......... 219/538, 85.16, 50, 78.01, 78.13, 219/444.1, 542–549
See application file for complete search history.

(56) References Cited

U.S. PATENT DOCUMENTS

| | | | | |
|---|---|---|---|---|
| 3,351,742 | A * | 11/1967 | Harris | 219/552 |
| 3,888,613 | A | 6/1975 | Fries et al. | |
| 3,892,940 | A * | 7/1975 | Bloem et al. | 219/634 |
| 5,306,898 | A * | 4/1994 | Yukawa et al. | 219/543 |
| 5,649,554 | A | 7/1997 | Sprinkel et al. | |
| 5,702,764 | A * | 12/1997 | Kimura et al. | 427/248.1 |
| 6,285,011 | B1 * | 9/2001 | Cherko | 219/426 |
| 6,815,646 | B2 * | 11/2004 | Ito et al. | 219/444.1 |
| 7,075,042 | B2 | 7/2006 | Kirby | |

(Continued)

FOREIGN PATENT DOCUMENTS

| | | |
|---|---|---|
| JP | 2005-086117 A | 3/2005 |
| JP | 2008-140647 A | 6/2008 |

OTHER PUBLICATIONS

International Search Report and the Written Opinion of the International Searching Authority, PCT/US2013/033139, Momentive Performance Materials Inc., Jun. 13, 2013.

*Primary Examiner* — Dana Ross
*Assistant Examiner* — Renee L Miller
(74) *Attorney, Agent, or Firm* — Joseph E. Waters, Esq.; McDonald Hopkins LLC

(57) ABSTRACT

A resistance heater is shown and described. The resistance heater may include a body. The body may include at least one heating surface, the heating surface being generally smooth and generally flat and a recess formed in the body, at least a portion of the body having a cross-sectional shape selected from the group consisting of: generally U shape, generally I-shape, and generally H-shape, and where the cross-sectional shape extends along at least a portion of the body.

22 Claims, 4 Drawing Sheets

(56) References Cited

U.S. PATENT DOCUMENTS

| | | | | |
|---|---|---|---|---|
| 7,361,865 | B2 * | 4/2008 | Maki et al. | 219/444.1 |
| 8,164,028 | B2 | 4/2012 | Morikawa et al. | |
| 2001/0042746 | A1 * | 11/2001 | Tanaka et al. | 219/541 |
| 2004/0074898 | A1 * | 4/2004 | Mariner et al. | 219/553 |
| 2005/0014031 | A1 * | 1/2005 | Hiramatsu et al. | 428/698 |
| 2005/0072773 | A1 * | 4/2005 | Kirby | 219/538 |
| 2005/0173413 | A1 * | 8/2005 | Goto | 219/544 |
| 2005/0217799 | A1 | 10/2005 | O'Meara et al. | |
| 2009/0200288 | A1 | 8/2009 | Morikawa et al. | |
| 2010/0000292 | A1 | 1/2010 | Karabacak et al. | |

* cited by examiner

RESISTANCE HEATER

CROSS-REFERENCE TO RELATED APPLICATION

This application is a continuation-in-part of U.S. patent application Ser. No. 12/321,284 filed on Jan. 26, 2009, which claims the benefit of U.S. Provisional Patent Application No. 61/021,907, entitled "Heater," filed on Jan. 18, 2008, both of which are hereby incorporated in its entirety by reference.

BACKGROUND

The present invention relates to a resistance heater made from a material such as graphite, SiC, etc., and more particularly to a heater to be used for directly or indirectly heating a semiconductor wafer in a semiconductor wafer processing device in which, for example, CVD (chemical vapor deposition) or other coating method is carried out.

An example of the prior art heaters is disclosed in Japanese patent publication No. 2005-86117(A). This heater uses an elongated ceramic body of a rectangular cross-section having greater width than thickness, which is formed into a ring or spiral configuration. This heater has low electric resistance, so that it will be required to use a power source that operates with low voltage and high current, resulting in increase of costs for the power source. In addition, this heater will tend to be bent, warped or deformed especially when it is subjected to a high temperature condition. This makes it impossible to uniformly heat a wafer or any other object to be processed at high temperature.

A typical shape of the prior art heater is shown in FIG. 3 herein, which includes an expanded view of terminal end portion with a connecting hole. The reason the terminal end portions have a widened and expanded shape at the end portion is that there needs to be decreased electric resistance at that portion so as to prevent that portion from over-heating. However, when using this heater, the expanded terminal end portion could make designing a heat pattern more difficult. A simple heat pattern could not be achieved with the prior art heater having the expanded terminal end portions.

SUMMARY

Accordingly, the present invention provides a heater having higher electric resistance and improved strength to prevent deformation of the heater even in a high temperature condition. The present invention also prevents excessive heat generation at terminal end portions of a heater, while the terminal end portion remains narrow and not expanded, thereby providing a wider choice in heat pattern design.

A resistance heater may include a body. The body of the resistance heater may include at least one heating surface, the heating surface being generally smooth and generally flat, a recess formed in the body, at least a portion of the body having a cross-sectional shape selected from the group consisting of: generally U shape, generally I-shape, and generally H-shape, and where the cross-sectional shape extends along at least a portion of the body.

A method for processing a semiconductor wafer may include the steps of providing a resistance heater having a body having at least one heating surface, the heating surface being generally smooth and generally flat; a recess formed in the body, at least a portion of the body having a generally horizontally symmetrical cross-sectional shape; and where the cross-sectional shape extends along at least a portion of the body. The method may further include supporting a semiconductor wafer on the at least one heating surface, applying an electric current to the heater, and heating the semiconductor wafer to a predetermined temperature.

A resistance heater may include a body. The body may include at least one heating surface, the heating surface being generally smooth and generally flat. The body may also include a recess formed in the body, at least a portion of the body having a generally horizontally symmetrical cross-sectional shape, and where the cross-sectional shape extends along at least a portion of the body.

BRIEF DESCRIPTION OF DRAWINGS

Other objects and advantages of the present invention can be understood from the following description when read in conjunction with the accompanying drawings in which.

DETAILED DESCRIPTION

Reference will now be made in detail to exemplary embodiments of the present invention, examples of which are illustrated in the accompanying drawings. It is to be understood that other embodiments may be utilized and structural and functional changes may be made without departing from the respective scope of the invention. Moreover, features of the various embodiments may be combined or altered without departing from the scope of the invention. As such, the following description is presented by way of illustration only and should not limit in any way the various alternatives and modifications that may be made to the illustrated embodiments and still be within the spirit and scope of the invention.

Figure 1:
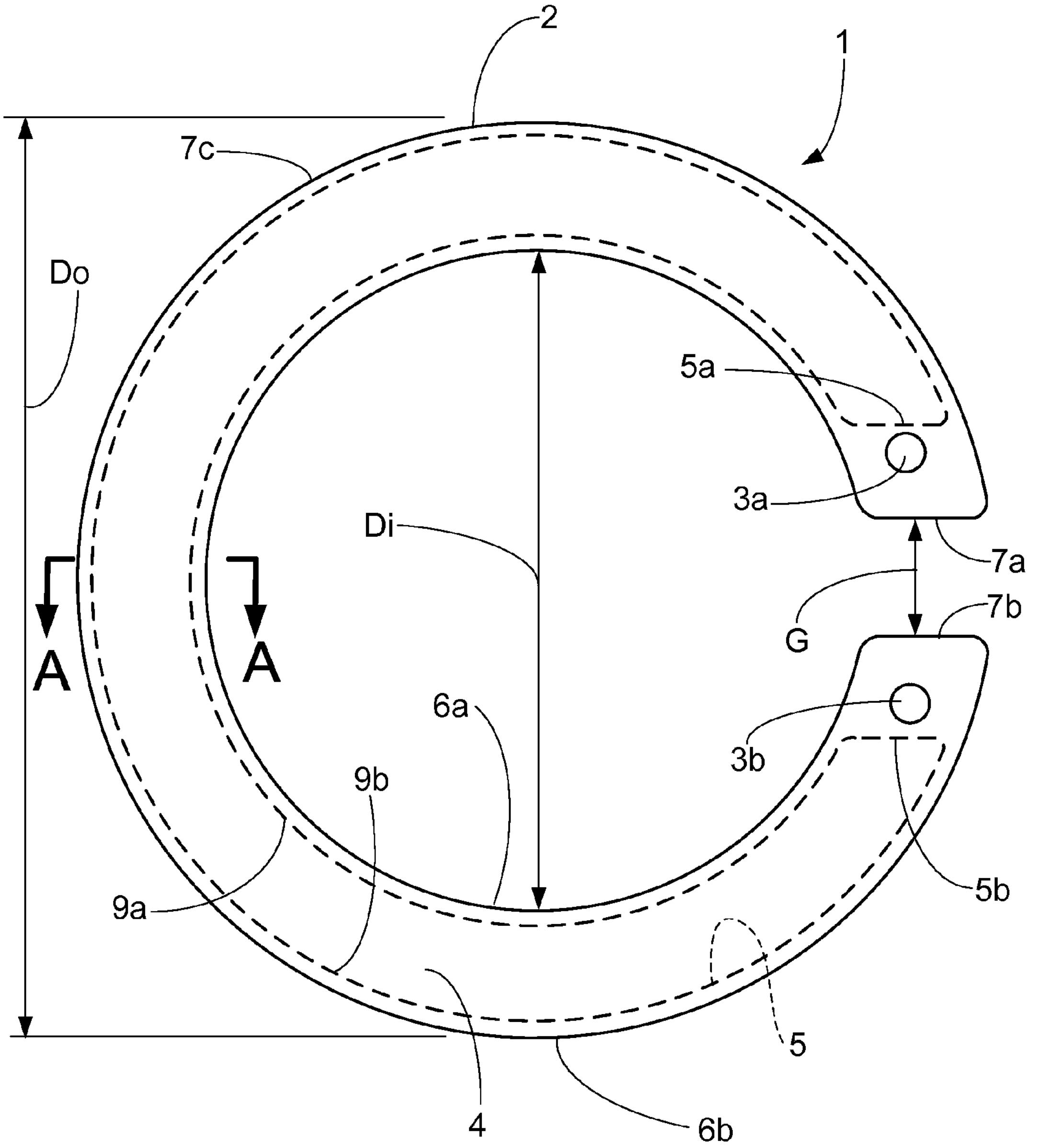
FIG. 1 is a plan view of a resistance heater embodying the present invention.
Figure 2:
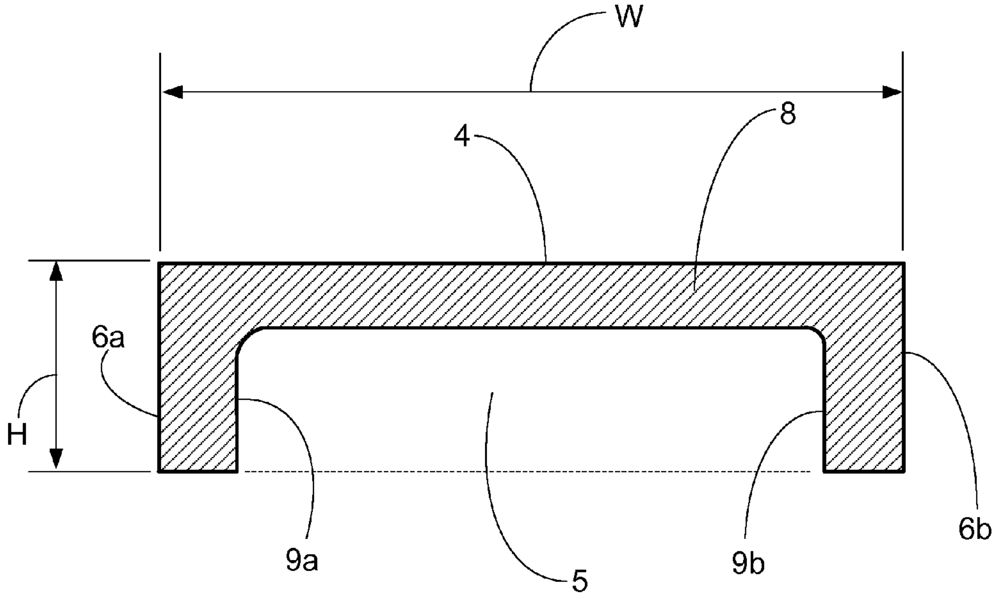
FIG. 2 is an enlarged cross-section taken along A-A in FIG. 1.
Figure 3:
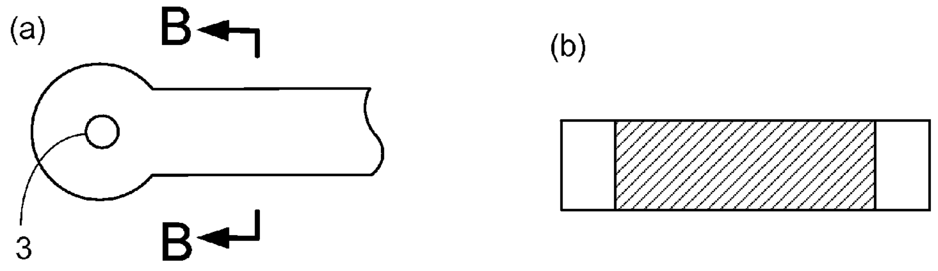
FIG. 3 shows a conventional heater, in which FIG. 3(*a*) is a partial plan view thereof and FIG. 3(*b*) is an enlarged cross-section taken along B-B in FIG. 3(*a*)

A heater embodying the present invention is shown in FIGS. 1 and 2. Heater 1 comprises a C-shaped heater body 2 made from a material such as graphite, ceramics such as SiC, etc. There are terminal connecting holes 3*a*, 3*b* at respective end portions of the C-shaped heater body 2, the opposing exterior end surfaces 7*a* and 7*b* being spaced apart so as to define a gap G therebetween. The connecting holes 3*a* and 3*b* are the points of attachment of an electrical power source which provides the electric current to the heater 1. By way of example, in this embodiment the heater body 2 can have a cross-section width W of about 20 mm, a height H of about 6 mm, an inner diameter Di of about 100 mm and an outer diameter Do of about 140 mm. These dimensions are exemplary of a suitable size. Other dimensions can be selected when appropriate.

As clearly shown in FIG. 2, which is an enlarged cross-section taken along A-A in FIG. 1, the heater body 2 has an upper horizontal wall 8 having a smooth and flat top heating surface 4 onto which an object to be heated, such as a wafer, is mounted directly or indirectly via a susceptor, etc. A center portion of the underside of the heater body 2 is recessed to form an elongated groove or recess 5 between a pair of opposite vertical side walls or ribs 6*a*, 6*b*, said side walls having inner surfaces 9*a* and 9*b* which at least partially define recess 5. The recess 5 and side walls 6*a*, 6*b* extend in an arcuate linear direction of the C-shaped heater body 2 so as to provide an inverted U-shaped cross section along a middle portion 7*c* of the heater, but not at the end portions of the heater body. In particular, the recess 5 terminates at end surfaces 5*a* and 5*b*, the portion of the body between recess end surfaces 5*a* and 5*b* and the respective exterior end surfaces 1*a* and 1*b* defining the respective end portions of the body. In one embodiment, the underside of the heater body having 20 mm width comprises the recess 5 having 16 mm width and the opposite side walls 6*a*, 6*b*, each having 2 mm width. The recess 5 is 4 mm deep from the underside of the heater body 2, leaving the upper horizontal wall 8 of 2 mm thickness.

As indicated above, it is a feature of the invention that body 2 has the same width W along its entire length, including both end portions and the middle portion 7*c* therebetween.

The heater of the present invention is particularly advantageous in semiconductor wafer processing applications. The full thickness of the body 2 at the end portions maintains a relatively cooler temperature at the end portions but the uniform width of the body improves control of the heat distribution pattern. The middle portion 7*c* of the body has a reduced cross sectional area available for electrical conduction thereby increasing, and improving heater resistance.

Example

A heater was fabricated in accordance with this invention having a width of 20 mm and a height of 6 mm, and which exhibited a resistance 0.09Ω In comparison, a control heater made of the same type material and having a width of 20 mm width and height of 6 mm, but fabricated without a recess 5 and ribs 6*a*, 6*b*, exhibited a resistance of 0.04Ω. These test results show that the heater resistance is dramatically improved by forming the recess 5 on the underside of the heater body 2.

Figure 4:
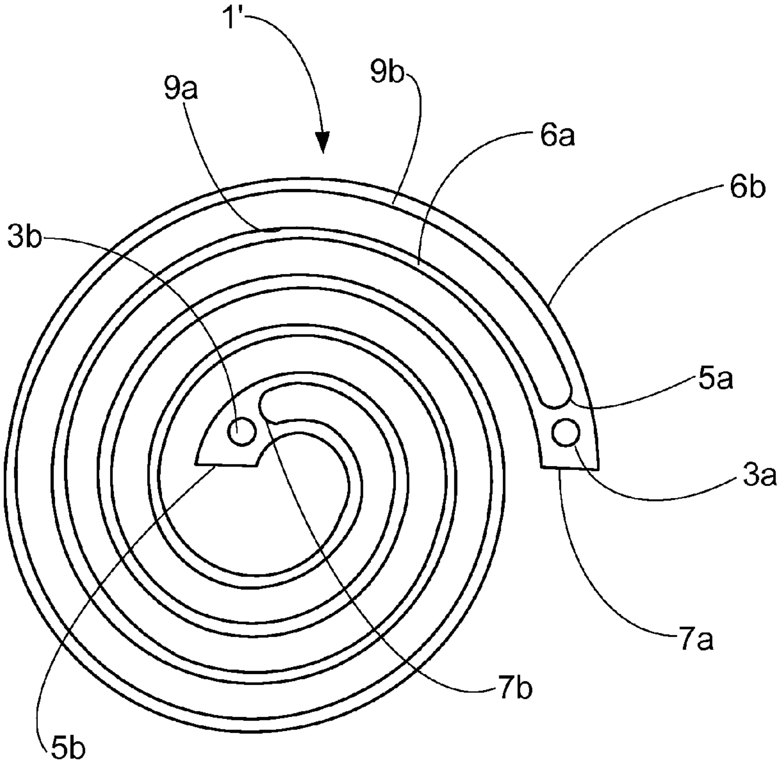
FIG. 4 is a plan view of a resistance heater embodying a spiral shape.
Figure 5:
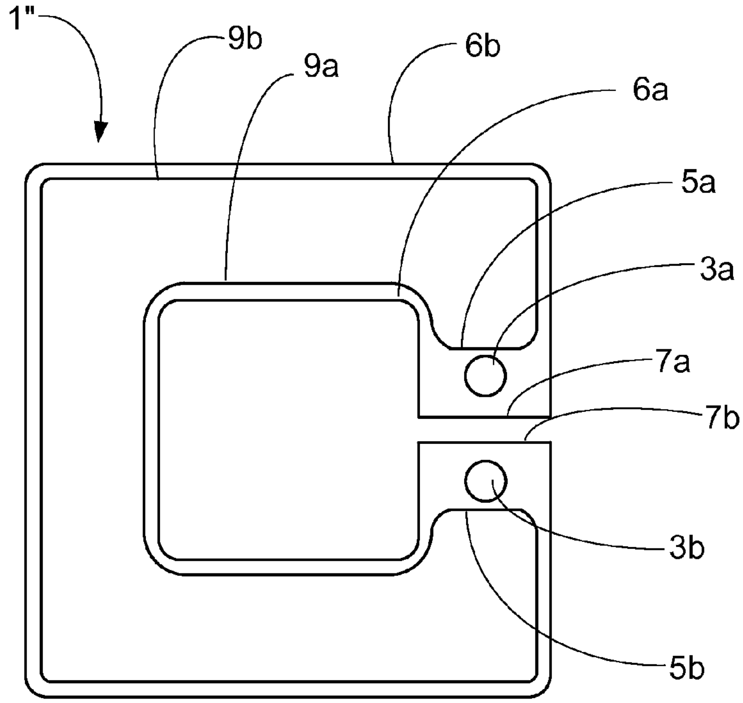
FIG. 5 is a plan view of a resistance heater embodying a rectangular shape.

Although the present invention has been described in reference to specific embodiment thereof shown in the accompanying drawings, it should be understood that the present invention is not limited to this specific embodiment and involves various modifications and changes without departing as far as they are within the spirit and scope of the invention defined in the appended claims. For example, the heater body is C-shaped in the illustrated embodiment, but in many cases, the heater body can be designed into a spiral heat pattern, such as heater 1' shown in FIG. 4, and as shown in Japanese patent publication No. 2005-86117(A), for uniform heating to the wafer or any other object to be heated. In some applications, the heater body is formed into a square or rectangular pattern, such as heater 1" shown in FIG. 5. These and other heater shapes are also within the scope of the present invention.

Additional embodiments of a resistance heater according the present teachings are described below. In the descriptions, all of the details and components may not be fully described or shown. Rather, the features or components are described and, in some instances, differences with the above-described embodiments may be pointed out. Moreover, it should be appreciated that these additional embodiments may include elements or components utilized in the above-described embodiments although not shown or described. Thus, the descriptions of these additional embodiments are merely exemplary and not all-inclusive nor exclusive. Moreover, it should be appreciated that the features, components, elements and functionalities of the various embodiments may be combined or altered to achieve a desired resistance heater without departing from the spirit and scope of the present teachings.

Figure 6:
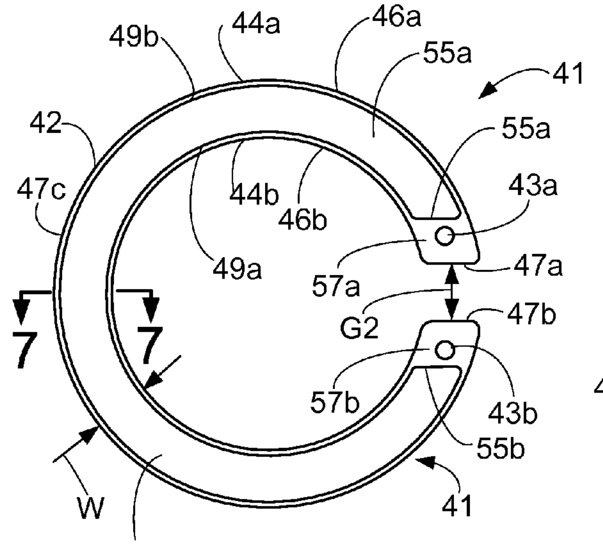
FIG. 6. is a plan view of other embodiments of a resistance heater.
Figure 7:
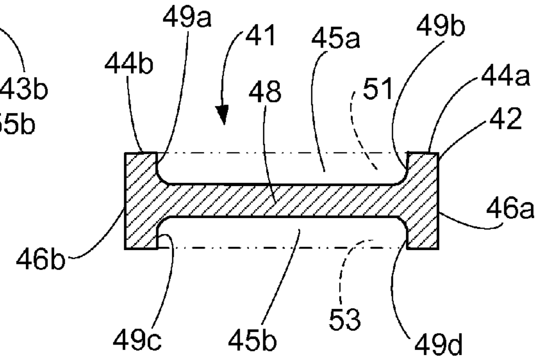
FIG. 7 is an enlarged cross-sectional view of the resistance heater of FIG. 6 taken along line 7-7.

Embodiments of a resistance heater are shown in FIGS. 6 and 7. Resistance heater 41 may include a generally a C-shaped heater body 42. The heater body 42 may be made from any appropriate material, such as by way of a non-limiting example, graphite, ceramics such as SiC, etc. The heater body 42 may include terminal connecting holes 43*a*, 43*b*, which may be located at respective end portions of the C-shaped heater body 42. The opposing exterior end surfaces 47*a* and 47*b* may be generally spaced apart so as to define a gap G2 between such. The connecting holes 43*a* and 43*b* may be the points of attachment of an electrical power source (not shown) that may provide the electric current to the resistance heater 41. By way of a non-limiting example, in these embodiments the heater body 42 may have a cross-sectional shape such as shown in FIG. 7.

As shown in FIG. 7 the heater body 42 may have a generally horizontally symmetrical cross-sectional shape, such as by way of a non-limiting example, a generally H-shaped cross-sectional shape. In these embodiments, the heater body 42 may include a generally centrally positioned and generally horizontal wall 48.

In these embodiments, a top and bottom central portion 51, 53 of the heater body 42 may be recessed to form a pair of elongated grooves or recesses 45*a*, 45*b* between a pair of opposite vertical side walls or ribs 46*a*, 46*b*. The recesses 45*a*, 45*b* may be positioned on both the top and bottom portion of the heater body 42. The side walls 46*a*, 46*b* may each include inner surfaces 49*a*, 49*b*, 49*c* and 49*d*, which may at least partially define the recesses 45*a*, 45*b*. The recesses 45*a*, 45*b* and side walls 46*a*, 46*b* may extend in an arcuate linear direction of the generally C-shaped heater body 42. This may provide a generally H-shaped cross sectional shape along at least a middle portion 47*c* of the resistance heater 41. The vertical side walls 46*a*, 46*b* may each possess a generally smooth and flat heating surface 44*a*, 44*b*, respectively onto which an object to be heated, such as a wafer, may be mounted directly or indirectly via a susceptor, etc.

The general H-shaped cross-sectional shape, however, may not extend to the end portions 47*a*, 47*b* of the heater body 42. By way of a non-limiting example, the recesses 45*a*, 45*b* may generally terminate at end surfaces 55*a* and 55*b*, the portion of the body 42 between recess end surfaces 55*a* and 55*b* and the respective exterior end surfaces 47*a* and 47*b* may define the respective end portions 57*a*, 57*b* of the body 42. By way of a non-limiting example, the topside and underside of the heater body 42 may have a width W of approximately 20 mm, which may include the recesses 45*a*, 45*b* having a width of approximately 16 mm and the opposite side walls 46*a*, 46*b* each having a width of approximately 6 mm. The recesses 45*a*, 45*b* may be approximately 2 mm deep from the topside and underside of the heater body 42, leaving the central horizontal wall 48 of a thickness of approximately 2 mm.

As indicated above, the body 42 may have width W along its entire length, including both end portions and the middle portion 47*c* therebetween. The width W may be generally consistent along an entire length of the body 42. In some embodiments, the width W may be approximately 20 mm. While the exemplary dimensions are described above, the present teachings are not limited to these specific dimensions. The dimensions are merely exemplary and may be altered as required.

Figure 8:
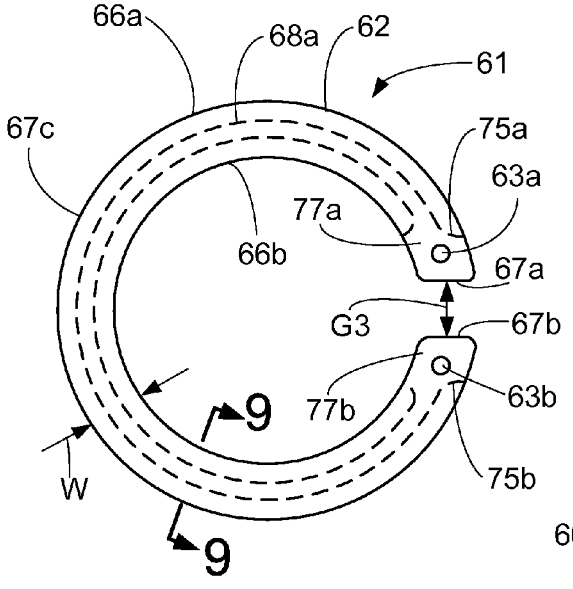
FIG. 8 is a plan view of other embodiments of a resistance heater.
Figure 9:
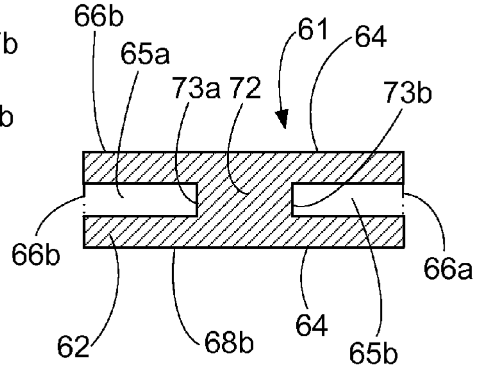
FIG. 9 is an enlarged cross-sectional view of the resistance heater of FIG. 8 taken along line 9-9.

Embodiments of a heater are shown in FIGS. 8 and 9. Resistance heater 61 may include a generally a C-shaped heater body 62. The heater body 62 may be made from any appropriate material, such as by way of a non-limiting example, graphite, ceramics such as SiC, etc. The heater body 62 may include terminal connecting holes 63*a*, 63*b*, which may be located at respective end portions of the C-shaped heater body 62. The opposing exterior end surfaces 67*a* and 67*b* may be generally spaced apart so as to define a gap G3 between such. The connecting holes 63*a* and 63*b* may be the points of attachment of an electrical power source (not shown) that may provide the electric current to the resistance heater 61. By way of a non-limiting example, in these embodiments the heater body 62 may have a cross-sectional shape such as shown in FIG. 9.

As shown in FIG. 9 the heater body 62 may have a generally symmetrical cross-sectional shape, such as by way of a non-limiting example, a generally I-shaped cross-sectional shape. Still further, the heater body 62 may have a generally horizontally symmetrical cross-sectional shape. In these embodiments, the heater body 62 may include a pair of generally horizontal walls 68*a* and 68*b*. The first wall 68*a* may be on the top portion of the body 62 and the second wall 68*b* may be on the bottom portion of the body 62. Either or both of the horizontal walls 68*a* and 68*b* may possess a generally smooth and flat heating surface 64 onto which an object to be heated, such as a wafer, may be mounted directly or indirectly via a susceptor, etc.

In these embodiments, a pair of side walls 66*a*, 66*b* of the heater body 62 may be recessed to form a pair of elongated grooves or recesses 65*a*, 65*b*. By way of a non-limiting example, the recesses 65*a*, 65*b* may be formed in the pair of opposite vertical side walls 66*a*, 66*b* in any appropriate manner. Once the recesses 65*a*, 65*b* may be formed in the vertical side walls 66*a*, 66*b*, a generally central wall 72 may be formed in the heater body 62. This may define the generally I-shaped cross-sectional heater body 42. Side walls 73*a*, 73*b* of the central wall 72 may define the recesses 65*a*, 65*b*.

The recesses 65*a*, 65*b* and side walls 73*a*, 73*b* may extend in an arcuate linear direction of the generally C-shaped heater body 62 so as to provide a generally I-shaped cross sectional shape along at least a middle portion 67*c* of the resistance heater 61. The generally I-shaped cross-sectional shape, however, may not extend to the end portions 75*a*, 75*b* of the heater body 62. By way of a non-limiting example, the recess 65*a*, 65*b* may terminate at end surfaces 75*a* and 75*b*. The portion of the body 62 between recess end surfaces 75*a* and 75*b* and the respective exterior end surfaces 67*a* and 67*b* may define the respective end portions 77*a*, 77*b* of the body 62.

By way of a non-limiting example, the topside and underside of the heater body 62 may have a width of approximately 20 mm, which may include the recesses 65*a*, 65*b* having a height of approximately 2 mm a depth of approximately 7 mm from the vertical side walls 66*a*, 66*b* of the heater body 62. This may result in the thickness of walls 68*a* and 68*b* at the recesses 65*a*, 65*b* each being approximately 2 mm. The central wall 72 may have a width of approximately 6 mm and a thickness of approximately 6 mm.

As indicated above, the body 62 may have width W along its entire length, including both end portions 77*a*, 77*b* and the middle portion 67*c* therebetween. The width W may be generally consistent along an entire length of the body 62 and may be approximately 20 mm. While the exemplary dimensions are described above, the present teachings are not limited to these specific dimensions. The dimensions are merely exemplary and may be altered as required.

Although the embodiments of the present invention have been illustrated in the accompanying drawings and described in the foregoing detailed description, it is to be understood that the present invention is not to be limited to just the embodiments disclosed, but that the invention described herein is capable of numerous rearrangements, modifications and substitutions without departing from the scope of the claims hereafter. The claims as follows are intended to include all modifications and alterations insofar as they come within the scope of the claims or the equivalent thereof.

What is claimed is:

1. A resistance heater comprising:
- a body comprising:
  - at least one heating surface defined by the body, the heating surface being generally smooth and generally flat;
  - a recess formed in at least a portion of the body, wherein the portion has a cross-sectional shape selected from the group consisting of: generally U shape, generally I-shape, and generally H-shape; and
  - wherein the cross-sectional shape extends along at least a portion of the length of the body.

2. The resistance heater of claim 1, wherein the cross-sectional shape extends along a majority of the length of the body.

3. The resistance heater of claim 1, wherein the body further includes first and second end portions and wherein the recess is not formed in the first and second end portions.

4. The resistance heater of claim 3 wherein the first and second end portions include a terminal connecting hole.

5. The resistance heater of claim 4, wherein the first and second end portions have substantially identical width to a heating area defined between the first and second end portions, and said recess is not formed at the first and second end portions.

6. The resistance heater of claim 1, wherein the body has a substantially uniform width along the length.

7. The resistance heater of claim 1 wherein the body is fabricated from at least one of graphite and ceramic material.

8. The resistance heater of claim 1 wherein the body is coated with at least one of pBN and SiC.

9. A method for processing a semiconductor wafer comprising the steps of:
- a) providing a resistance heater having a body having at least one heating surface defined by the body, the heating surface being generally smooth and generally flat; a recess formed in at least a portion of the body, wherein the portion has a generally horizontally symmetrical cross-sectional shape; and wherein the cross-sectional shape extends along at least a portion of the length of the body;
- b) supporting a semiconductor wafer on the at least one heating surface;
- c) applying an electric current to the heater; and
- d) heating the semiconductor wafer to a predetermined temperature.

10. The method of claim 9, wherein the body further includes first and second end portions and wherein the recess is not formed in the first and second end portions.

11. The method of claim 10 wherein the first and second end portions include a terminal connecting hole.

12. The method of claim 11, wherein the first and second end portions have substantially identical width to a heating area defined between the first and second end portions, and said recess is not formed at the first and second end portions.

13. The method of claim 9 wherein the body is coated with at least one of pBN and SiC.

14. A resistance heater comprising:

a body comprising:

at least one heating surface defined by the body, the heating surface being generally smooth and generally flat;

a recess formed in at least a portion of the body, wherein the portion has a generally horizontally symmetrical cross-sectional shape; and wherein the cross-sectional shape extends along at least a portion of the length of the body.

15. The resistance heater of claim 14, wherein the cross-sectional shape of at least a portion the body is generally I-shaped or H-shaped.

16. The resistance heater of claim 14, wherein recess is formed in portions of both first and second surfaces of the body forming a generally I-shaped cross-sectional shape.

17. The resistance heater of claim 16, wherein the first and second surfaces are top and bottom surfaces of the body, respectively.

18. The resistance heater of claim 14, wherein recess is formed in portions of both first and second surfaces of the body forming a generally H-shaped cross-sectional shape.

19. The resistance heater of claim 18, wherein the first and second surfaces are opposite side surfaces of the body.

20. The resistance heater of claim 14, wherein the body has a substantially uniform width along its length.

21. The method of claim 9, wherein the cross-sectional shape of at least a portion of the body is selected from the group consisting of: generally U shape, generally I-shape, and generally H-shape.

22. The method of claim 21, wherein the cross-sectional shape comprises a majority of the length of the body.

* * * * *